(12) United States Patent
Kim et al.

(10) Patent No.: US 9,806,248 B2
(45) Date of Patent: Oct. 31, 2017

(54) NANOFIBER-BASED THERMOELECTRIC GENERATOR MODULE, METHOD FOR MANUFACTURING THE SAME, AND ELECTROSPINNING APPARATUS FOR MANUFACTURING NANOFIBERS THEREFORE

(71) Applicant: KOREA UNIVERSITY RESEARCH AND BUSINESS FOUNDATION, Seoul (KR)

(72) Inventors: Sang Sig Kim, Seoul (KR); Kyoung Ah Cho, Seoul (KR); Jin Yong Choi, Seoul (KR); Dong Hoon Lee, Gwacheon-si (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/845,780

(22) Filed: Sep. 4, 2015

(65) Prior Publication Data
US 2016/0072036 A1 Mar. 10, 2016

(30) Foreign Application Priority Data
Sep. 5, 2014 (KR) .......................... 10-2014-0119312

(51) Int. Cl.
*H01L 35/32* (2006.01)
*D01D 5/00* (2006.01)
(Continued)

(52) U.S. Cl.
CPC .......... *H01L 35/32* (2013.01); *B29C 47/0014* (2013.01); *D01D 5/0076* (2013.01);
(Continued)

(58) Field of Classification Search
CPC .................................................. H01L 35/32
See application file for complete search history.

(56) References Cited

U.S. PATENT DOCUMENTS

| 4,969,956 A * | 11/1990 | Kreider et al. ......... H01L 35/08 |
| | | 136/201 |
| 9,263,662 B2 * | 2/2016 | Boukai et al. .......... H01L 35/32 |

FOREIGN PATENT DOCUMENTS

| JP | 2008-227178 A | 9/2008 |
| JP | 2010-539349 A | 12/2010 |

(Continued)

OTHER PUBLICATIONS

Cambridge Dictionary, "Definition of Intersection", Accessed Nov. 2016, http://dictionary.cambridge.org/us/dictionary/english/intersection, All Pages.*

Primary Examiner — Devina Pillay
Assistant Examiner — Daniel Malley, Jr.
(74) Attorney, Agent, or Firm — Rabin & Berdo, P.C.

(57) ABSTRACT

The present invention provides a method of manufacturing a nanofiber-based thermoelectric generator module, the method comprising: an electrode formation step of forming a plurality of electrodes and a plurality of second electrodes so as to be spaced apart from and opposite to each other in an alternately staggered arrangement relative to each other; a first nanofiber arrangement step of arranging a first nonofiber including an n-type or p-type semiconductor; and a second nanofiber arrangement step of arranging a second nonofiber including a semiconductor of a type different from the type of the semiconductor forming the first nanofiber, a nanofiber-based thermoelectric generator module manufactured by the method, and an electrospinning apparatus of manufacturing nanofibers for the nanofiber-based thermoelectric generator module.

8 Claims, 15 Drawing Sheets

(51) Int. Cl.
*H01L 35/34* (2006.01)
*B29C 47/00* (2006.01)

(52) U.S. Cl.
CPC ........... *D01D 5/0092* (2013.01); *H01L 35/34* (2013.01); *B29C 47/0076* (2013.01)

(56) References Cited

FOREIGN PATENT DOCUMENTS

| | | |
|---|---|---|
| JP | 2014-047440 A | 3/2014 |
| KR | 10-2011-0061751 A | 6/2011 |
| KR | 10-2013-0108856 | 10/2013 |
| KR | 10-2014-0065597 | 5/2014 |
| KR | 10-1432835 B1 | 8/2014 |

\* cited by examiner

NANOFIBER-BASED THERMOELECTRIC GENERATOR MODULE, METHOD FOR MANUFACTURING THE SAME, AND ELECTROSPINNING APPARATUS FOR MANUFACTURING NANOFIBERS THEREFORE

CROSS-REFERENCE TO RELATED APPLICATIONS

This application claims the benefit of Korean Patent Application No. 10-2014-0119312, filed on Sep. 5, 2014 in the Korean Intellectual Property Office, which is incorporated herein by reference in its entirety.

BACKGROUND OF THE INVENTION

1. Field of the Invention

The present invention relates to a thermoelectric generator module, and more particularly, to such a thermoelectric generator module including nanofibers.

2. Description of Related Art

In general, thermoelectric effect means a reversible and direct energy conversion between heat and electricity. The thermoelectric effect is classified into the Peltier effect which is applied to a cooling field using a temperature difference between both ends of a material formed by a current applied from the outside, and the Seebeck effect which is applied to a power generation field using an electromotive force generated from a temperature difference between both ends of a material.

Thermoelectric cooling is a vibration-free and low-noise eco-friendly cooling technology which does not make use of a refrigerant gas causing environmental problems, and application areas can be widen to a general-purpose cooling field including a refrigerator, an air conditioner or the like through the development of a high-efficiency thermoelectric cooling material.

Also, in the case of a thermoelectric power generation technology employing the Seebeck effect, if a thermoelectric material is applied to heat dissipating equipment or a relevant section in an automobile engine, an industrial plant or the like, power generation can be performed by a temperature difference between both ends of the material. In spacecrafts for remote planets in which the use of a solar energy is impossible, such a thermoelectric power generation system is already in operation.

The thermoelectric generator module is a circuit in which p-type or n-type conductors or semiconductors are electrically connected with each other end to end so that current is caused to flow by means of a thermo-electromotive force generated when one side of the module is used as a hot source and the other side of the module is used as a cold source, Currently, the development of a thermoelectric generator module using nanofibers is in progress to achieve the compactness of such a thermoelectric generator module. As an example of this technology, Korean Patent Laid-Open Publication No. 2011-0061751 (hereinafter, referred to as 'prior art 1') discloses an invention which is directed to nanoparticles having a high electrical conductivity or a nanocrystalline inorganic material.

In addition, Korean Patent No. 1432835 (hereinafter, referred to as 'prior art 2') discloses a method for producing nanofibers by treating a fiber including a thermoelectric active material or a precursor compound of a thermoelectric active material.

However, the prior arts 1 and 2 entail a problem in that the manufacturing process is complicated, and there is a limitation in the manufacture of a large-capacity module and an increase in the performance of the thermoelectric device module, thus causing a problem in that the degree of freedom of design of the thermoelectric device module is decreased.

SUMMARY OF THE INVENTION

Accordingly, the present invention has been made to solve the above-mentioned problems occurring in the prior arts, and it is an object of the present invention to provide a thermoelectric generator module, a method of manufacturing the same, and an electrospinning apparatus of manufacturing nanofibers for the thermoelectric generator module, in which the thermoelectric generator module can be manufactured using nanofibers to improve the power generation performance of the thermoelectric generator module, the manufacturing cost of the thermoelectric generator module can be reduced through the simplification of the manufacturing process and structure of the thermoelectric generator module, the thermoelectric generator module can be developed as a compact structure, and various arrangement structures including a serial connection structure and a vertical stack structure using nanofibers manufactured by the electrospinning apparatus can be implemented, thus leading to an increase in the degree of freedom of design.

To achieve the above object, in one aspect, the present invention provides a method of manufacturing a nanofiber-based thermoelectric generator module, the method including: an electrode formation step of forming a plurality of electrodes and a plurality of second electrodes so as to be spaced apart from and opposite to each other in an alternately staggered arrangement relative to each other; a first nanofiber arrangement step of arranging a first nonofiber including an n-type or p-type semiconductor, the first nanofiber being connected at one end thereof to the first electrode and connected at the other end thereof to a second electrode which is opposite to the first electrode; and a second nanofiber arrangement step of arranging a second nonofiber including a semiconductor of a type different from the type of the semiconductor forming the first nanofiber, the second nanofiber being connected at one end thereof to the first electrode and connected at the other end thereof to another second electrode which is opposite to the first electrode.

In the nanofiber-based thermoelectric generator module manufacturing method, the first nanofiber arrangement step may include: a first nanofiber pattern formation step of forming a first nanofiber pattern including a first nanofiber opening for forming the first nanofiber on the substrate using a photoresists; a first nanofiber transfer step of providing a first nanofiber bundle including the first nanofiber, and transferring the provided first nanofiber bundle onto the first nanofiber pattern including the first nanofiber opening; a protective layer formation step of forming a protective layer on one side of the first nanofiber bundle; and a lift-off step of removing the photoresist forming the first nanofiber pattern.

In the nanofiber-based thermoelectric generator module manufacturing method, the first nanofiber transfer step may include: a first nanofiber bundle provision step of providing a first nanofiber bundle including a first nanofiber including an n-type or p-type semiconductor among nanofibers alignedly formed between counter electrode parts of an electrospinning counter electrode unit electrically charged alternately by a switching power unit from a polymer solution sprayed from an electrospinning nozzle that is applied with a high voltage from an electrospinning high voltage unit; and a first nanofiber transfer execution step of executing a transfer of the provided first nanofiber bundle onto the first nanofiber pattern including the first nanofiber opening.

In the nanofiber-based thermoelectric generator module manufacturing method, the second nanofiber arrangement step may include: a second nanofiber pattern formation step of forming a second nanofiber pattern including a second nanofiber opening for forming the second nanofiber on the substrate using a photoresists; a second nanofiber transfer step of providing a second nanofiber bundle including the second nanofiber, and transferring the provided second nanofiber bundle onto the second nanofiber pattern including the second nanofiber opening; a protective layer formation step of forming a protective layer on one side of the second nanofiber bundle; and a lift-off step of removing the photoresist forming the second nanofiber pattern.

In the nanofiber-based thermoelectric generator module manufacturing method, the second nanofiber transfer step may include: a second nanofiber bundle provision step of providing a second nanofiber bundle including a second nanofiber including a semiconductor of a type different from the type of the semiconductor forming the first nanofiber among nanofibers alignedly formed between counter electrode parts of an electrospinning counter electrode unit electrically charged alternately by a switching power unit from a polymer solution sprayed from an electrospinning nozzle that is applied with a high voltage from an electrospinning high voltage unit; and a first nanofiber transfer execution step of executing a transfer of the provided second nanofiber bundle onto the second nanofiber pattern including the second nanofiber opening.

In another aspect, the present invention provides a nanofiber-based thermoelectric generator module manufactured by any one of the above described methods.

In the nanofiber-based thermoelectric generator module, the substrate may be a transparent substrate, and the first electrode and the second electrode may have a preset light transmission property that allows light is transmitted from one side to the other side on the substrate.

In still another aspect, the present invention provides a nanofiber-based thermoelectric generator module including a plurality of module unit bodies stackingly formed longitudinally between a hot source and a cold source which are two difference heat sources, wherein each of the module unit bodies includes: a first nanofiber mesh including a first nanofiber including an n-type or p-type semiconductor; a second nanofiber mesh including a second nanofiber including a semiconductor of a type different from the type of the semiconductor forming the first nanofiber; an insulator layer interposed between the first nanofiber mesh and the second nanofiber mesh; a first electrode configured to interconnect ends of the first nanofiber mesh and the second nanofiber mesh; and a second electrode connected one end thereof to the second nanofiber mesh and connected at the other end thereof to a first nanofiber mesh of another adjoining module unit body stacked.

In the nanofiber-based thermoelectric generator module, the first nanofiber mesh and the second nanofiber mesh may at least include a mesh intersection region where the nanofiber meshes are intersected with each other and a mesh non-intersection region where the nanofiber meshes are not intersected with each other when nanofiber meshes are stacked and projected onto a plane, and the first electrode or the second electrode is disposed at the mesh non-intersection region.

In the nanofiber-based thermoelectric generator module, the first electrode and the second electrode may be formed of a conductive slurry or a conductive solution.

In the nanofiber-based thermoelectric generator module, the first electrode and the second electrode may be formed of a conductive film or a conductive paste.

In the nanofiber-based thermoelectric generator module, the first electrode and the second electrode may be transparent electrodes, and the insulator layer may have a preset light transmission property.

In yet another aspect, the present invention provides a method of manufacturing a nanofiber-based thermoelectric generator module, the method including: a nanofiber mesh provision step of providing a first nanofiber mesh including a first nanofiber including an n-type or p-type semiconductor, and a second nanofiber mesh including a second nanofiber including a semiconductor of a type different from the type of the semiconductor forming the first nanofiber; and a module unit body stacking step of stacking one or more module unit bodies, each of which includes the first nanofiber mesh and the second nanofiber mesh.

In the nanofiber-based thermoelectric generator module manufacturing method, the nanofiber mesh provision step may include: a first nanofiber mesh formation step of forming a first nanofiber mesh including a first nanofiber including an n-type or p-type semiconductor among nanofibers alignedly formed between counter electrode parts of an electrospinning counter electrode unit electrically charged alternately by a switching power unit from a polymer solution sprayed from an electrospinning nozzle that is applied with a high voltage from an electrospinning high voltage unit; and a second nanofiber mesh formation step of forming a second nanofiber mesh including a second nanofiber including a semiconductor of a type different from the type of the semiconductor forming the first nanofiber among nanofibers alignedly formed between counter electrode parts of an electrospinning counter electrode unit electrically charged alternately by a switching power unit from a polymer solution sprayed from an electrospinning nozzle that is applied with a high voltage from an electrospinning high voltage unit.

In the nanofiber-based thermoelectric generator module manufacturing method, the module unit body stacking step may include: a first nanofiber mesh arrangement step of arranging the first nanofiber mesh of each module unit body; an insulator layer arrangement step of arranging an insulating layer on one side of the first nanofiber mesh of the each module unit body; a second nanofiber mesh arrangement step of arranging the second nanofiber mesh on one side of the insulator layer of the each module unit body; a first electrode formation step of forming a first electrode for interconnecting one ends of the first nanofiber mesh and the second nanofiber mesh of the each module unit body; an insulator layer arrangement step of arranging another insulating layer on one side of the second nanofiber mesh of the each module unit body; a first nanofiber mesh arrangement step of arranging a first nanofiber mesh of another module unit body on one side of the other insulator layer; and a second electrode formation step of forming a second electrode connected at one end thereof to the second nanofiber mesh and connected at the other end thereof to the first nanofiber mesh of the other module unit body.

In the nanofiber-based thermoelectric generator module manufacturing method, the first nanofiber mesh and the second nanofiber mesh may at least include a mesh intersection region where the nanofiber meshes are intersected with each other, and a mesh non-intersection region where the nanofiber meshes are not intersected with each other when the nanofiber meshes are stacked and projected onto a plane, and the first electrode and the second electrode are disposed at the mesh non-intersection region in the first nanofiber mesh arrangement step and the second nanofiber mesh arrangement step.

In the nanofiber-based thermoelectric generator module manufacturing method, each of the first electrode formation step and the second electrode formation step may further include: an electrode coating step of coating a conductive slurry or solution to form the first electrode and the second electrode; and an electrode curing step of curing the coated conductive slurry or solution.

In the nanofiber-based thermoelectric generator module manufacturing method, each of the first electrode formation step and the second electrode formation step may further include: an electrode coating step of coating a conductive paste to form the first electrode and the second electrode; and an electrode curing step of curing the coated conductive paste.

In a further aspect, the present invention provides an electrospinning apparatus for manufacturing nanofibers, including: a base; an electrospinning output unit including an electrospinning nozzle disposed above and spaced part from the base, and an electrospinning high voltage unit configured to apply a high voltage to the electrospinning nozzle, the electrospinning nozzle being configured to be supplied with a polymer solution for forming nanofibers and spray the polymer solution in the form of a jet, and an electrospinning induction unit including an electrospinning counter electrode unit including a plurality of counter electrodes disposed on one surface of the base so as to be opposite to the electrospinning nozzle, and a switching power unit configured to electrically charge the electrospinning counter electrode unit alternately.

In the electrospinning apparatus for manufacturing nanofibers, the electrospinning counter electrode unit may include: a first counter electrode part including one or more counter electrodes; and a second counter electrode part including one or more counter electrodes that are disposed to be at least partially opposite to the first counter electrode part.

In the electrospinning apparatus for manufacturing nanofibers, the electrospinning counter electrode unit may include: a first counter electrode part including one or more counter electrodes; a second counter electrode part including one or more counter electrodes that are disposed so as to be at least partially opposite to the first counter electrode part; a third counter electrode part including one or more counter electrodes that are disposed to be orthogonal to the first counter electrode part; and a fourth counter electrode part including one or more counter electrodes that are disposed to be opposite to the third counter electrode part, wherein the first to fourth counter electrode part forms a square arrangement structure.

In the electrospinning apparatus for manufacturing nanofibers, the electrospinning counter electrode unit may include: two or more counter electrode parts, each of which includes one or more counter electrodes, wherein one of the counter electrode parts is disposed to be at least partially opposite to an at least part of the other of the counter electrode parts.

In the electrospinning apparatus for manufacturing nanofibers, the electrospinning apparatus may further include an over frame disposed on the top of one side of the electrospinning counter electrode unit so as to be interposed between the electrospinning counter electrode unit and the electrospinning output unit, and configured to allow the nanofibers formed from the polymer solution discharged from the electrospinning nozzle to be collected thereon, wherein the over frame may include a through-hole formed at the center thereof.

In the electrospinning apparatus for manufacturing nanofibers, the over frame may be at least partially formed of a conductive material.

ADVANTAGEOUS EFFECTS

The thermoelectric generator module and the manufacturing method thereof according to the present invention as constructed above have the following advantageous effects.

A large area module can be realized using nanofibers formed by the electrospinning apparatus and the manufacturing process and structure of the thermoelectric generator module can be simplified to reduce the manufacturing cost.

In addition, a stereoscopic arrangement is possible through a serial connection structure and a vertical stack structure on a horizontal plane so that the thermoelectric generator module of the present invention can actively cope with applicable environments.

Further, the manufacturing cost of the thermoelectric generator module can be reduced through the simplification of the manufacturing process and structure of the thermoelectric generator module and the thermoelectric generator module can be developed as a compact structure.

Moreover, the present invention is a very advanced invention in that the bridge structure employing electrodes and nanofibers is disposed in various patterns, thus leading to an increase in the degree of freedom of design to improve the thermoelectric generation efficiency.

BRIEF DESCRIPTION OF THE DRAWINGS

The above and other objects, features and advantages of the present invention will be apparent from the following detailed description of the preferred embodiments of the invention in conjunction with the accompanying drawings, in which.

EXPLANATION ON REFERENCE NUMERALS OF MAIN ELEMENTS IN THE DRAWINGS

Figure 1:
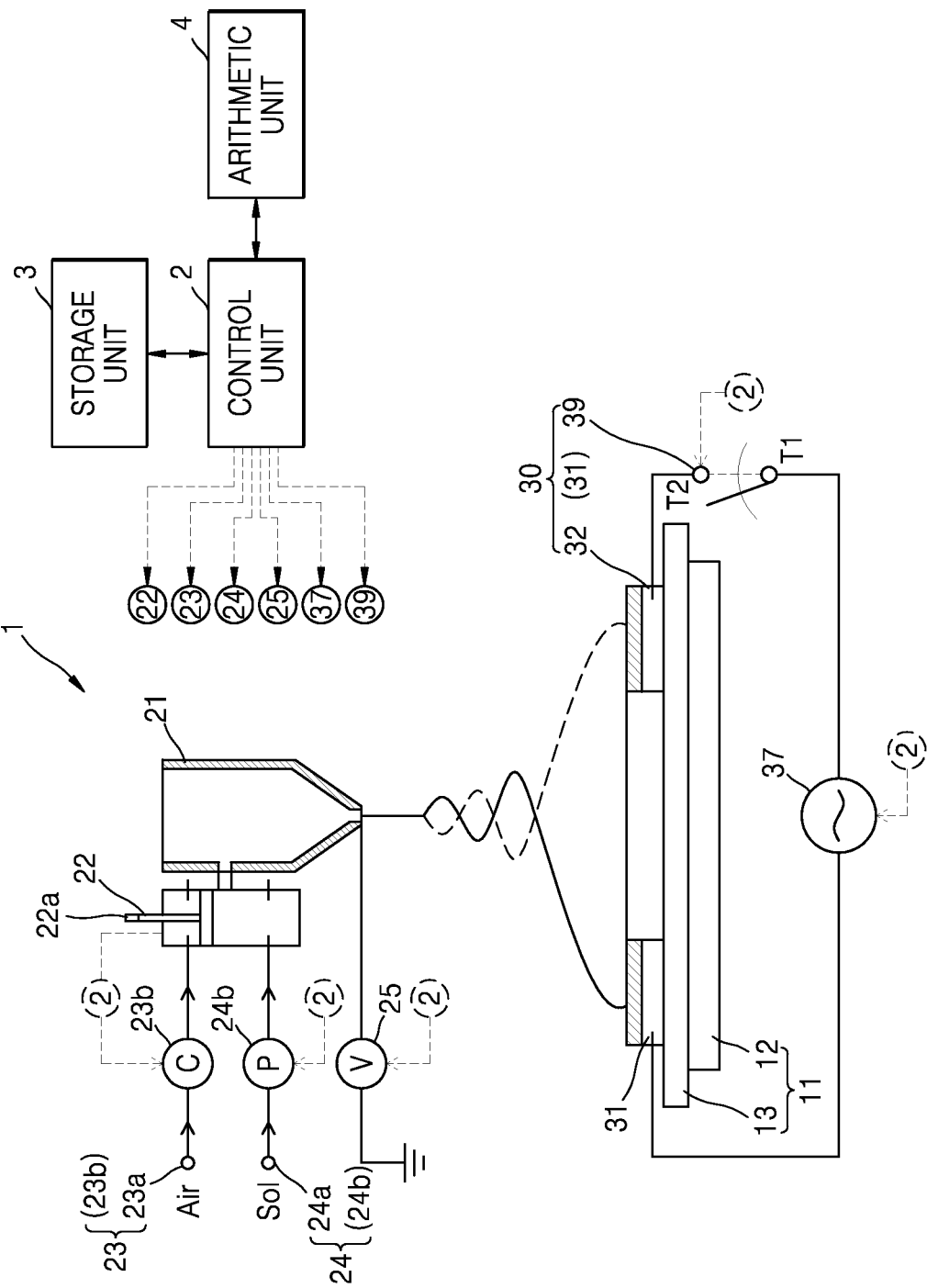
FIG. 1 is a block diagram illustrating a configuration of an electrospinning apparatus for manufacturing nanofibers included in a nanofiber-based thermoelectric generator module according to an embodiment of the present invention.

1: electrospinning apparatus for manufacturing nanofibers
10: nanofiber-based thermoelectric generator module
20: first electrode
30: second electrode
50: first nanofiber
60: second nanofiber
$T_H, T_L$: heat source
100: substrate

DESCRIPTION OF THE PREFERRED EMBODIMENTS

Hereinafter, a thermoelectric generator module and a method of manufacturing the same according of the present invention will be described in detail with reference to the accompanying drawings.

The drawings to be provided below are provided by way of example so that the idea according to the present invention can be sufficiently transferred to those skilled in the art to which the present invention pertains. Therefore, the present invention is not limited to the drawings presented below, and may be embodied in other forms.

In addition, unless otherwise defined, the terms as used herein have the same meanings as those generally understood by those skilled in the art to which the present invention pertains. In the following description and the accompanying drawings, the detailed description on known related functions and constructions will be omitted to avoid unnecessarily obscuring the subject matter of the present invention hereinafter.

A nanofiber-based thermoelectric generator module according to the present invention includes nanofibers formed by an electrospinning apparatus. First, an apparatus and process for manufacturing nanofibers included in the nanofiber-based thermoelectric generator module of the present invention will be described hereinafter.

In FIG. 1, there is shown a schematic diagram illustrating a nanofiber bundle or a nanofiber mesh including nanofibers included in the nanofiber-based thermoelectric generator module according to an embodiment of the present invention, or an electrospinning apparatus 1 for manufacturing nanofibers.

As used herein, the term "nanofiber" refers to a certain ultramicro fiber such as a nanothread or a nanofiber, and the term "mesh" refers to a structure in which eyes are formed by a nanothread or a nanofiber in which meshes or nets are cross-arranged. The electrospinning apparatus 1 for manufacturing nanofibers according to an embodiment of the present invention includes an electrospinning output unit 20 and an electrospinning induction unit 30. A base 11 is used as a constituent element that supports a substrate for collecting nanofibers that are electrospun and a counter electrode as a charged body for inducing nanofibers which will be described later.

The base 11 includes a base support 12 and a base plate 13. The base support 12 has a structure in which it is disposed below the base plate 13 to support the base plate 13 so that the base plate is maintained in a horizontal state. The base support 12 may have a predetermined shift structure for the base plate 13 by taking an XY stage drive structure, if necesary.

An electrospinning counter electrode unit (31, 32, 33 and 34) of the electrospinning induction unit 30 which will be described later can be disposed on one surface of the base plate 13. Although not shown in this embodiment, a separate linear rail and a linear motion block movable on the linear rail may be provided on the one surface of the base plate 13, and the electrospinning counter electrode unit may be disposed on the linear motion block to adjust the distance of the electrospinning counter electrode unit. As such, the electrospinning apparatus of the present invention can be modified in various manners.

The electrospinning output unit 20 includes an electrospinning nozzle 21 and an electrospinning high voltage unit 25. More specifically, the electrospinning output unit 20 may further include an electrospinning supply unit (22, 23 and 24) that selectively or exclusively receives a material for forming nanofibers, for example, an n-type or p-type semiconductor or a material including the semiconductor, or a polymer or conductive polymer including a material such as CNT or $TiO_2$, and provides the material or the polymer to the electrospinning nozzle 21.

In this embodiment, a material having a molecular weight of 7000 was used as the conductive polymer. A precursor and a polymer solution enabling the fabrication of an n-type oxide (ZnO) and Co-based p-type oxides ($Ca_3Co_4O_9$, $NaCo_2O_4$, $La_{0.95}Sr_{0.05}CoO_3$, $Bi_2Sr_2Co_2O_x$) were mixed in a solvent such as water or ethanol at a weight ratio of 10:90-60:40 to thereby obtain a polymer spinning solution, but the present invention is not limited thereto and various materials may be selected within the scope of forming an n-type or p-type nanofiber.

The electrospinning nozzle 21 includes a nozzle opening for allowing a conductive polymer solution to be discharged to the outside, and an end, i.e., a tip of the electrospinning nozzle 21 is connected to the electrospinning high voltage unit 25.

In this embodiment, the electrospinning nozzle 21 takes a structure in which the nozzle opening thereof has a diameter of from 0.25 mm to 1.00 mm, and the electrospinning high voltage unit 25 applies a voltage ranging from 7 kV to 11 kV to the tip of the electrospinning nozzle 21 and achieves the flow of a feed flow rate ranging from 0.01 to 1.00 μl/h. But, the diameter of the nozzle opening of the electrospinning nozzle, and the voltage applied by and the feed flow rate achieved by the electrospinning high voltage unit are not limited to the above numerical values, and various selections may be made depending on the entire work environment, including a material of the polymer solution discharged through the nozzle opening and a discharge pressure of the electrospinning nozzle.

Meanwhile, the electrospinning nozzle 21 is connected to the electrospinning supply unit, and a polymer solution supplied to the electrospinning nozzle 21 from the electrospinning supply unit is discharged to the outside through the nozzle tip.

The electrospinning supply unit includes a solution supply part 24, a solution feed part 23, and a solution reservoir 22. The solution supply part 24 includes a solution source 24a and a solution supply pump 24b. The solution feed part 23 includes a feed source 23a and a feed compressor 23b.

The solution source 24a is a repository that accommodates a polymer solution, and the solution supply pump 24b is connected to the solution source 24a to allow the polymer solution from the solution source 24a to be supplied to the electrospinning nozzle 21 side, more specifically the solution reservoir 22. The solution reservoir 22 is also connected to the solution feed part 23, and the feed source 23a of the solution feed part 23 delivers the polymer solution from the solution reservoir 22 to the electrospinning nozzle while providing a given feed pressure to the electrospinning nozzle so as to prevent a decrease in fluidity of the solution due to a certain viscosity and permit the solution to be smoothly discharged from the electrospinning nozzle. The feed source 23a may be merely air in the atmosphere, and may be formed as separate inert gas. As such, various modifications are possible, but filtered air was used as the feed source 23a in this embodiment.

The feed compressor 23b connected to the feed source 23a provides a given feed pressure to supply certain compressed gas to the solution reservoir 22 and allows the polymer solution to be smoothly delivered from the solution reservoir 22 to the electrospinning nozzle 21 by a given feed pressure transferred through the feed gas, and thus enables polymer fibers to be smoothly and continuously discharged to the outside through the nozzle opening of the electrospinning nozzle 21.

In this case, the solution reservoir 22 includes two divided spaces, i.e., a space where the feed gas is introduced and received and a space where the polymer solution is received, so as to prevent the feed gas from the feed source from being mixed with the polymer solution. A separate spool 22a is disposed between the two divided spaces so that a syringe type structure may be implemented in which the feed pressure of the feed gas is transferred to the polymer solution side.

The electrospinning supply unit of the present invention is merely an example and may take various configurations within the scope of providing the polymer solution to the electrospinning nozzle 21.

The electrospinning induction unit 30 includes an electrospinning counter electrode unit (31, 32; 33, 34) and a switching power unit (37, 39). The electrospinning counter electrode unit (31, 32; 33, 34) is disposed to be opposite to the electrospinning nozzle 21. The electrospinning counter electrode unit (31, 32; 33, 34) is connected to the switching power unit (37, 39) to form a certain charged state so that the polymer fibers discharged from the electrospinning nozzle between the electrospinning counter electrode unit and the electrospinning nozzle 21 applied with a high voltage can be induced to the electrospinning counter electrode unit (31, 32; 33, 34) to form nanofibers. Herein, an element named a nanofiber may denote a nanothread which is a polymer fiber that is continuously discharged from the electrospinning nozzle to form a continuous line, and may refer to a nanothread having a short length, which is disposed or formed on the thermoelectric generator module which will be described later.

The electrospinning counter electrode unit (31, 32; 33, 34) includes a plurality of counter electrodes which is disposed on one surface of the base 11 so as to be opposite to the electrospinning nozzle 21. In this embodiment, the electrospinning counter electrode unit includes a first counter electrode part 31 and a second counter electrode part 32 (see FIGS. 1 and 2).

The first counter electrode part 31 includes one or more counter electrodes. In this embodiment, the first counter electrode part 31 is implemented as a one strip-type counter electrode. The second counter electrode part 32 includes one or more counter electrodes which are disposed so as to be at least partially opposite to the first counter electrode part 31. In this embodiment, each of the first counter electrode 31 and the second counter electrode part 32 is formed as a single conductive strip so that they are disposed on one surface of the base 1 so as to be opposite and parallel to each other.

The switching power unit (37, 39) is connected to the first counter electrode part 31 and the second counter electrode part 32 of the electrospinning counter electrode unit to electrically charge the first counter electrode part 31 and the second counter electrode part 32 alternately. The switching power unit includes a switching power supply 37 for applying AC power for alternate electrical charging of the first counter electrode part 31 and the second counter electrode part 32, and an alternating switch 39 for interrupting the application of the AC power to each of the first counter electrode part 31 and the second counter electrode part 32. The switching power unit is driven in response to an alternating control signal from a control unit 2, particularly the first counter electrode part 31 and the second counter electrode part 32 form an electrically charged state in an alternating and sequential manner. The electrospinning apparatus for manufacturing nanofibers may take a configuration in which it further includes a storage unit 3 and an arithmetic unit 4 so as to store a reference value for controlling each constituent element or implement a control process through a comparison operation.

In this embodiment, the first counter electrode part 31 and the second counter electrode part 32 are formed as conductive strip structures which are parallel to each other, but may be modified in various manners, such as arranging the first counter electrode part in a row or in a predetermined arrangement method, and forming the first counter electrode part as a set of a plurality of counter electrodes of forming a sequential or predetermined electrical charging order so as to prevent the nanofibers from being concentrated on a specific region of the first counter electrode part 31 in a process forming a nanofiber bundle, i.e., a nanofiber aggregate by electrically charging the first counter electrode part 31 and the second counter electrode part 32 alternately, if necessary.

Figure 2:
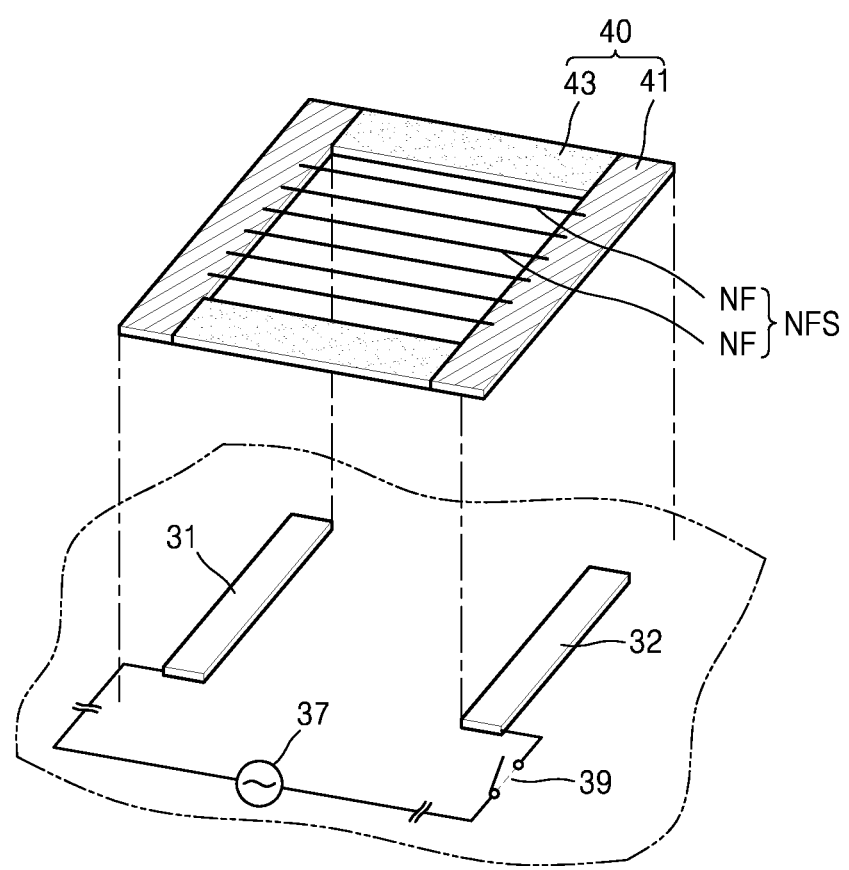
FIG. 2 is a schematic arrangement view illustrating an over frame of an electrospinning apparatus for manufacturing nanofibers according to the present invention.

Nanofibers (NFs) formed through such an arrangement structure of the counter electrode unit can form a nanofiber bundle (NFR: nanofiber rope) which is a nanofiber aggregate aligned horizontally (see FIG. 2). The thus formed nanofiber bundle may be subjected to an additional process step. For example, the nanofiber bundle may be subjected to a curing process in which it is exposed to a curing chamber environment of about 100° C. to evaporate a solvent contained the polymer solution through a heat treatment. In addition, the nanofiber bundle may undergo an annealing process in which a fusion heat treatment is performed on the polymer fiber at a high temperature higher than a melting point of the polymer fiber to at least partially remove the polymer fiber to form the nanofiber bundle consisting of the nanofibers so that an organic material as a polymer can be partially removed, if necessary. Certain grains are formed through this process so that the thermal conductivity can be lowered and the electrical conductivity can be increased.

In addition, the electrospinning apparatus for manufacturing nanofibers may further include an over frame 40 disposed on one side of the electrospinning counter electrode unit, if necessary. The over frame 40 is disposed on the top of one side of the electrospinning counter electrode unit so as to be interposed between the electrospinning counter electrode unit and the electrospinning output unit, and serves to collect polymer nanofibers discharged from the electrospinning nozzle 21 thereon. In this embodiment, the over frame 40 is formed as a square frame but is not limited thereto. A follow-up operation for the feed or transfer of the nanofibers formed after the completion of the electrospinning of the polymer solution through the electrospinning nozzle may be performed through the collection of the polymer nanofibers on the over frame 40.

The over frame 40 may take a structure in which it is at least partially formed of a conductive material. In other words, as shown in FIG. 2, the over frame 40 includes a conductive frame part 41 and a non-conductive frame part 43. The conductive frame part 41 is formed to correspond to the arrangement position of the electrospinning counter electrode unit so that the induction of the polymer nanofiber by the alternate electrical charging of the first counter electrode part 31 and the second counter electrode part 32 can be prevented from being inhibited.

Meanwhile, In the above embodiment, the electrospinning counter electrode unit takes the conductive strip structure in which two counter electrode parts are disposed in parallel to each other, but the electrospinning counter electrode unit (31, 32; 33, 34) of the present invention may be configured in various manners. In other words, the electrospinning counter electrode unit (31, 32; 33, 34) includes two or more counter electrode parts which are disposed to be spaced apart from each other, and each counter electrode part includes one or more counter electrodes. One of the counter electrode parts may be disposed to be at least partially opposite to an at least part of the other of the counter electrode parts.

Figure 3:
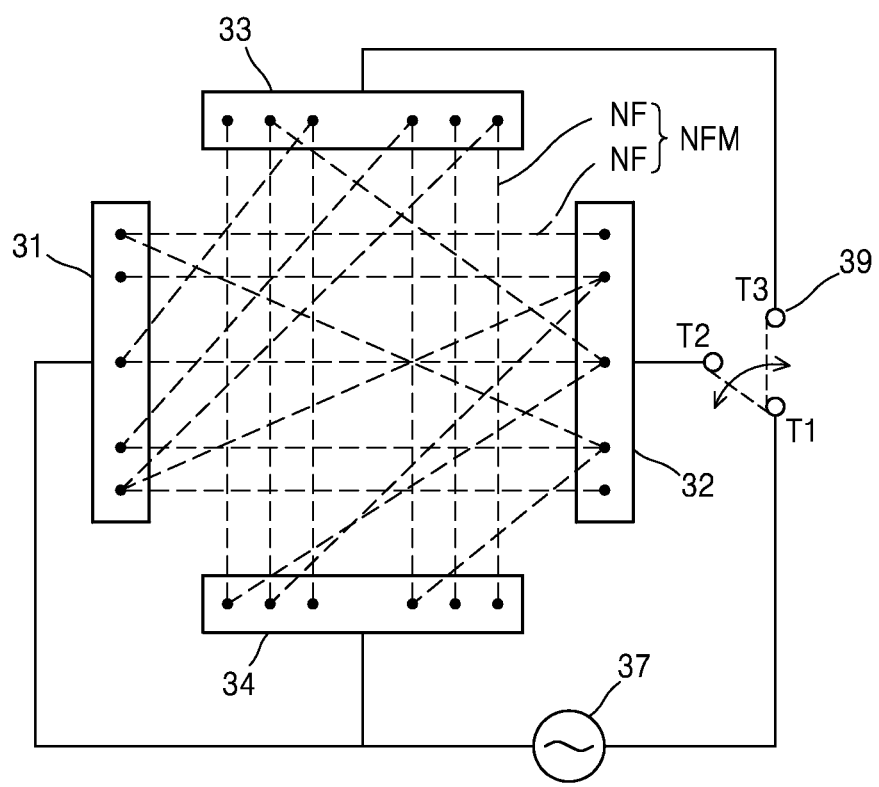
FIG. 3 is a schematic partial top plan view illustrating another example of an electrospinning apparatus for manufacturing nanofibers according to the present invention.

In another example, as shown in FIG. 3, the electrospinning counter electrode unit may include a first counter electrode part 31, a second counter electrode part 32, a third counter electrode part 33, and a fourth counter electrode part 34, which form a square arrangement structure so that a structure can be implemented in which the first counter electrode part 31 and the second counter electrode part 32, and the third counter electrode part 33 and the fourth counter electrode part 34 are disposed to be opposite to each other, respectively. By virtue of this structure, a nanofiber mesh (NFM) can be formed in which the nanofiber (NF) is formed in a web shape.

Hereinafter, a nanofiber-based thermoelectric generator module formed using the nanofiber or an aggregate such as the nanofiber bundle or the nanofiber mesh, manufactured by the electrospinning apparatus for manufacturing the nanofibers, and a method for manufacturing the thermoelectric generator module will be described.

Figure 4:
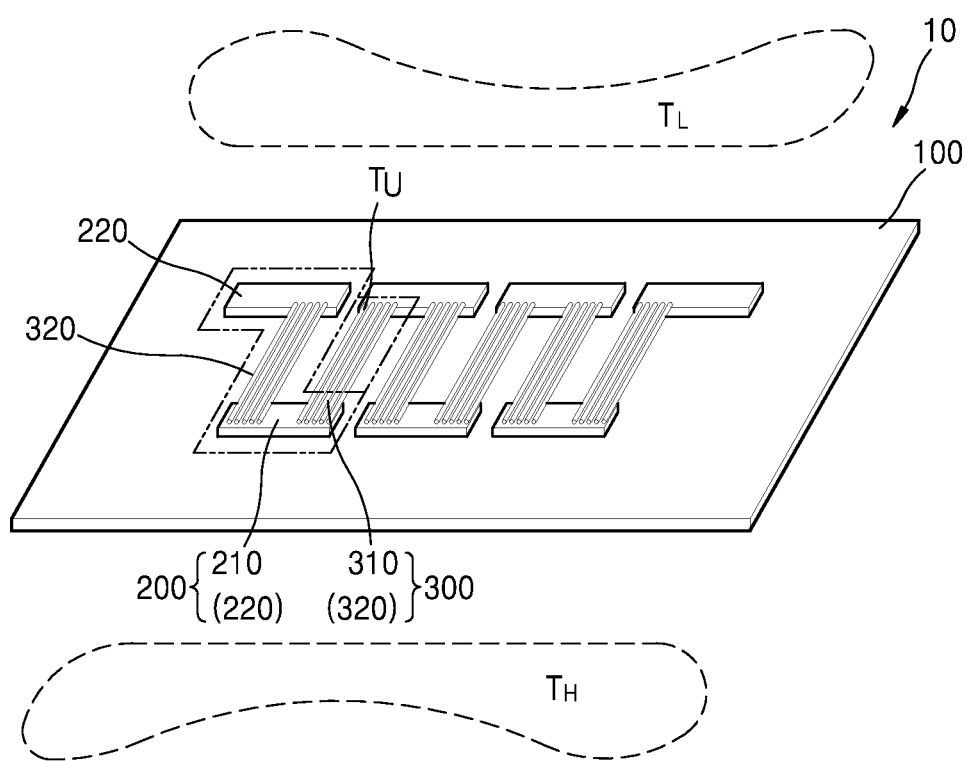
FIG. 4 is a diagrammatic view illustrating a configuration of a nanofiber-based thermoelectric generator module according to another embodiment of the present invention.

FIG. 4 illustrates an example of a nanofiber-based thermoelectric generator module 10 according to the present invention.

The nanofiber-based thermoelectric generator module 10 includes a set of module unit bodies TU as basic fundamental structures, which are disposed between two heat sources, i.e., a hot source $T_H$, and a cold source $T_L$ to perform thermoelectric power generation. The module unit body TU includes a first electrode 210, a second electrode 220, a first nanofiber 310, and a second nanowire 320. The first electrode 210 can be disposed at one of the heat sources, i.e., the hot source $T_H$, and the second electrode 220 can be disposed at the other of the heat sources, i.e., the cold source $T_L$ so as to be spaced apart from the first electrode 210. The first nanofiber 310 is configured to interconnect the first electrode 210 and the second electrode 220 and is composed of an n-type or p-type semiconductor. The second nanowire 320 is composed of a semiconductor of a type different from the type of the semiconductor forming the first nanofiber 310. The second nanowire 320 is connected at one end thereof to the first electrode and is connected at the other end thereof to a second electrode 220 of another module unit body TU adjoining to the module unit body TU.

Herein, the nanofibers 310 and 320 are manufactured by the nanofiber electrospinning apparatus 1. The nanofiber-based thermoelectric generator module according to an embodiment of FIG. 4 employs the nanofiber bundle formed by the nanofibers, and a process of manufacturing the nanofiber-based thermoelectric generator module of FIG. 4 will be described hereinafter.

Figure 5:
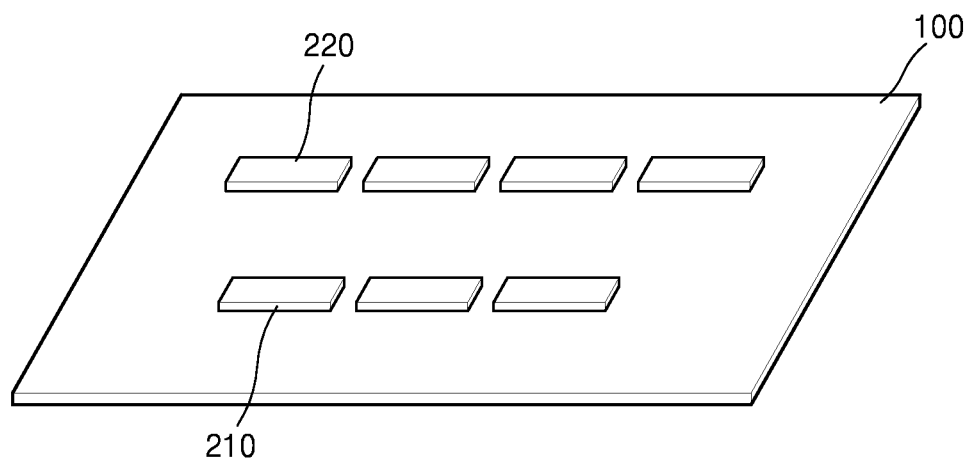
FIGS. 5 to 17 illustrate partial perspective views and partial side cross-sectional views of a nanofiber-based thermoelectric generator module during the manufacture thereof according to another embodiment of the present invention.
Figure 6:
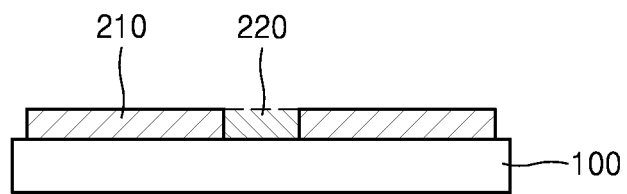
Figure 7:
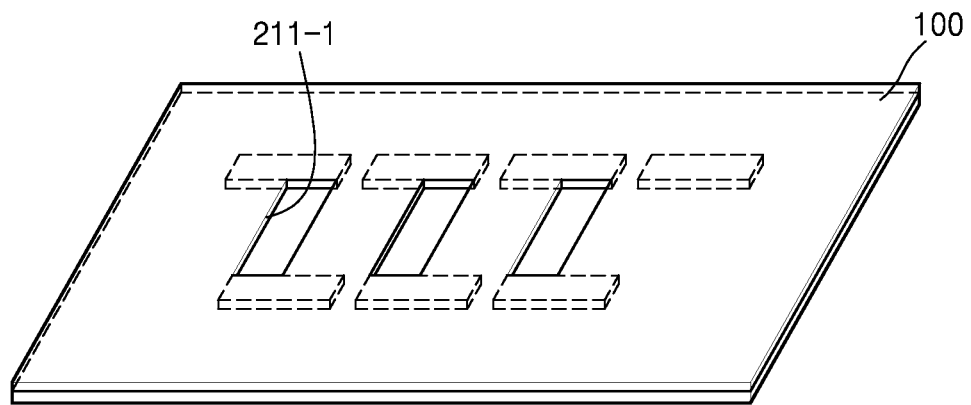
Figure 8:
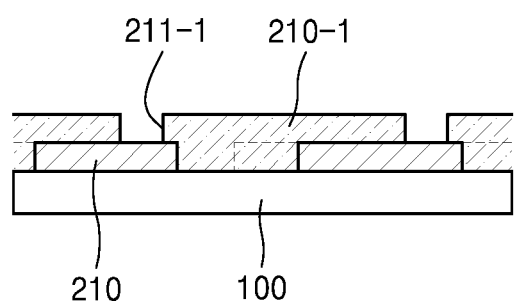

First, as show in FIGS. 5 and 6, an electrode formation step is performed. In FIG. 6, there is shown a side cross-sectional view of a vertical stack structure formed centering on the first electrode 210 of FIG. 5. In other words, the first electrode 210 and the second electrode 220 can be formed on one side of a substrate 100 using a typical photolithography process. The first electrode 210 and the second electrode 220 can take a structure in which multiple first electrodes 210 and multiple second electrodes 220 are arranged in a row so as to be spaced apart from and opposite to each other in an alternately staggered arrangement relative to each other. In other words, when viewed from a side cross-sectional direction, the first electrode and the second electrode form an alternately staggered arrangement structure to have a structure in which both ends of the first electrode 210 intersect with a partial region of a second electrode 220 constituting each module unit body TU and a partial region of a second electrode of another adjoining module unit body TU so that one of the nanofibers, for example, the first nanofiber 310 is connected to the first electrode and the second electrode of the same module unit body, and the second nanofiber 320 is connected to a second electrode of another module unit body adjoining to the first electrode as formed in a process which will be described later.

In the meantime, a material for forming the first electrode 210 and the second electrode 220 may include at least one selected from the group consisting of silver (Ag), aluminum (Al), titanium (Ti), gold (Au), platinum (Pt), nickel (Ni), molybdenum (Mo), gallium (Ga), tantalum (Ta), iridium(Ir), copper (Cu), tungsten (W), ruthenium(Ru), zinc (Zn), tin (Sn), carbon (C), and indium (In). For example, the first electrode 210 and the second electrode 220 may be formed as a single material such as tungsten (W) or platinum (Pt), and may be formed of a transparent material such as ITO, IZTO or IGZO as in this embodiment.

Herein, the substrate may be can be implemented as a flexible substrate. The flexible substrate may be formed of any one selected from among Polydimethylsiloxane (PDMS), polyimide, polycarbonate, Poly(methyl methacrylate) (PMMA), cyclic olefin copolymer (COC), parylene, polyethylene terephthalate (PET), polybutylene terephthalate (PBT), polysilane, polysiloxane, polysilazane, polycarbosilane, polyacrylate, polymethacrylate, polymethylacrylate, polyethylacrylate, polyethylmetacrylate, cyclic olefin polymer (COP), polyethylene (PE), polyprophylene (PP), polystyrene (PS), polyoxymethylene (POM), poly(ether ether ketone) (PEEK), polyether sulfone (PES), polytetrafluoroethylene (PTFE), polyvinyl chloride (PVC), polyvinylidene fluoride (PVDF), and perfluoroalkyl ethyl acrylate (PFA), or a combination thereof.

The substrate can use various materials selected depending on the design specification. A substrate made of a transparent material may be selected, if necessary. In other words, the substrate of the present invention may be a transparent substrate, and the first electrode and the second electrode may be transparent electrodes having a preset light transmission property that allows light to be transmitted from one side to the other side on the transparent substrate. If the substrate, the first electrode and the second electrode have such a light transmission property or transparent structure, utility of a compact electronic device is increased and the degree of freedom of design of the thermoelectric generation module can be drastically increased.

After the electrodes 210 and 220 are formed on the substrate 100, a first nanofiber arrangement step is performed. In the first nanofiber arrangement step, the first nanofiber takes a structure in which it is connected at one end thereof to the first electrode 210 and connected at the other end thereof to a second electrode which is opposite to the first electrode. The first nanofiber 310 includes an n-type or p-type conductor or semiconductor, and the second nanofiber 320 which will be described later includes a semiconductor of a type different from the type of the semiconductor forming the first nanofiber. Thus, the first and second nanofibers take an alternative structure in which if the first nanofiber includes an n-type conductor or semiconductor, the second nanofiber includes a p-type conductor or semiconductor, and if the first nanofiber includes a p-type conductor or semiconductor, the second nanofiber includes an n-type conductor or semiconductor.

More specifically, the first nanofiber arrangement step includes a first nanofiber pattern formation step and a first nanofiber transfer step.

The first nanofiber pattern formation step forms a first nanofiber pattern 210-1 on the substrate 100 using a photoresist. The first nanofiber pattern 210-1 includes a first nanofiber opening 211-1. The first nanofiber opening 211-1 is formed in the first nanofiber pattern 210-1 to correspond to a position where the first nanofiber 310 will be formed. In this embodiment, one or more first nanofiber openings 211-1 are formed at predetermined intervals so that one ends of the first electrodes 210 and one ends of the second electrodes 220 in the same module unit body are exposed to the outside.

Thereafter, a first nanofiber transfer step is performed. The first nanofiber transfer step provides a first nanofiber bundle NFR 310-1 including the first nanofiber NF, and transfers the provided first nanofiber bundle onto the first nanofiber pattern 210-1 including the first nanofiber opening 211-1.

Figure 9:
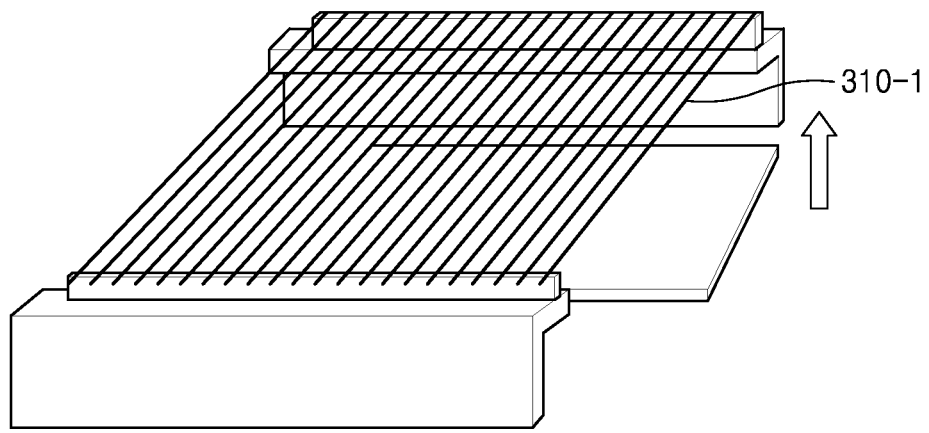
Figure 10:
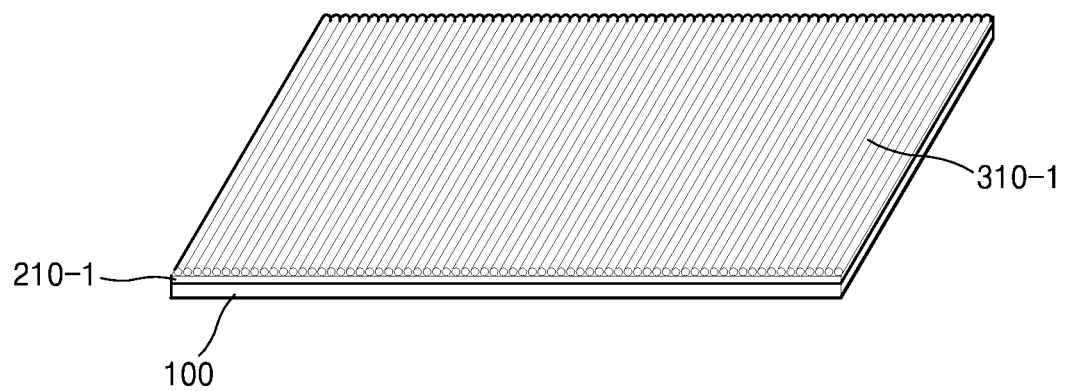
Figure 11:
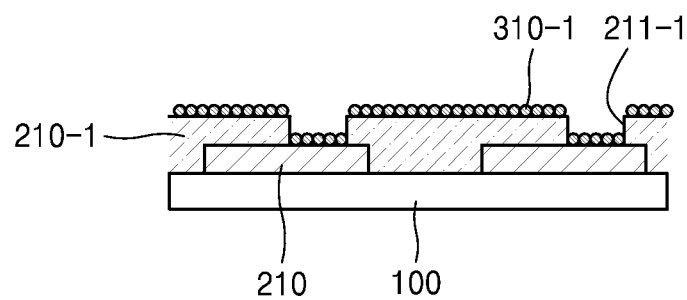

In other words, as shown in FIGS. 9 to 11, a nanofiber bundle NFR including a plurality of nanofibers NFs arranged in the above-described nanofiber electrospinning apparatus 1 is disposed above the substrate 100, and the substrate 100 is feed from the bottom and is moved to one side of the first nanofiber pattern 210-1 so that the nanofiber bundle NFR is disposed on the first nanofiber pattern 210-1. In this process, the first nanofiber 310 is formed on one side of the substrate including the first electrode 210 through the first nanofiber opening 211-1 formed in the first nanofiber pattern 210-1.

Figure 12:
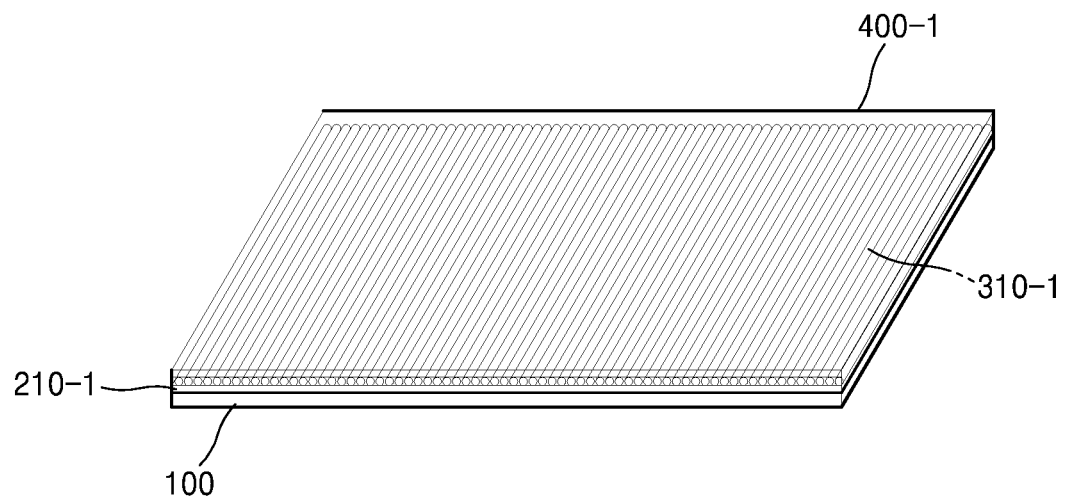
Figure 13:
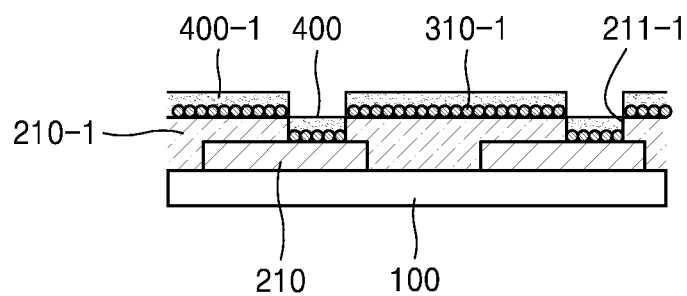

Subsequently, as shown in FIGS. 12 and 13, a protective layer formation step is performed. In the protective layer formation step, a protective layer 400-1 is formed on side of the first nanofiber bundle 310-1. A substantial protective layer 410 is formed on one side of the first nanofiber 310 formed on the substrate 100 through the first nanofiber opening 211-1. Such a protective layer may include, for example, a nitride layer or an oxide layer. Examples of a material for forming the nitride layer or the oxide layer may include $Al_2O_3$, $Ta_2O_5$, $SiO_2$, SiBN and $Si_3N_4$.

Figure 14:
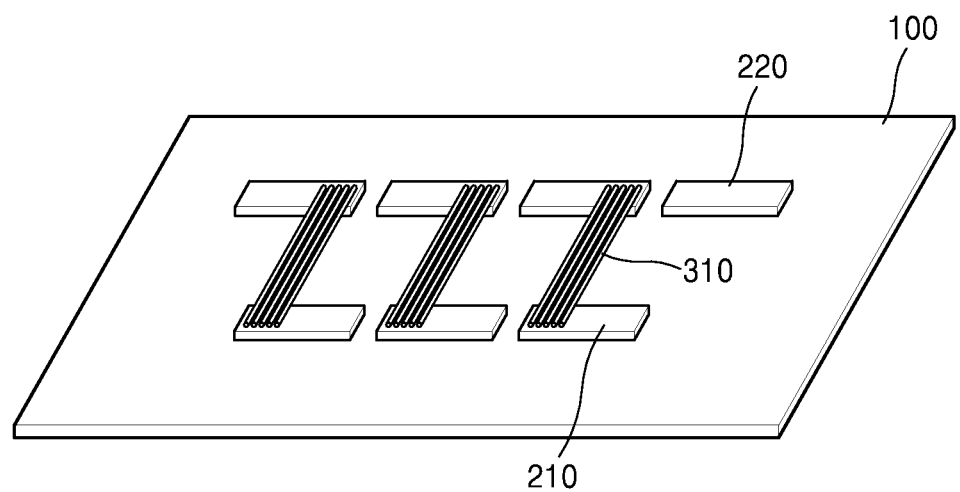
Figure 15:
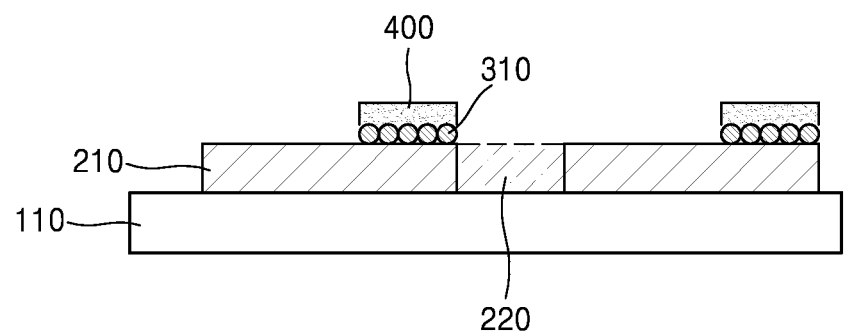

Thereafter, as shown in FIGS. 14 and 15, a lift-off step of removing the photoresist formed on the substrate to form the first nanofiber pattern is performed. Through this process, the first nanofiber 310 for interconnecting the first electrode and the second electrode in the same module unit body and the protective layer 400 for protecting the first nanofiber 310 on the substrate 100 can be formed.

Subsequently, the first nanofiber formation process is repeatedly performed with respect to the second nanofiber, and thus a detailed description thereof will be omitted to avoid redundancy and a description will be made centering on a difference between the first nanofiber and the second nanofiber.

After the formation of the first nanofiber is completed, a second nanofiber arrangement step is performed. In the second nanofiber arrangement step, the second nanofiber takes a structure in which it is connected at one end thereof to the other end of the first electrode 210 and is connected at the other end thereof to a second electrode 220 of another adjoining module unit body, and the second nanofiber 320 includes a semiconductor of a type different from the type of the semiconductor forming the first nanofiber.

The second nanofiber arrangement step includes a second nanofiber pattern formation step and a second nanofiber transfer step. The second nanofiber pattern formation step forms a second nanofiber pattern 210-2 on the substrate 100 using a photoresists. The second nanofiber pattern 210-2 includes a second nanofiber opening 211-2. The second nanofiber opening 211-2 is formed to correspond to a position where the second nanofiber 320 will be formed on the second nanofiber pattern 210-2. In this embodiment, one or more second nanofiber opening 211-2 are formed at predetermined intervals so that one ends of the first electrodes 210 and one ends of the second electrodes 220 in another adjoining module unit body are exposed to the outside.

Thereafter, a second nanofiber transfer step is performed. The second nanofiber transfer step provides a second nanofiber bundle NFR 320-1 including the second nanofiber NF, and transfers the provided second nanofiber bundle onto the second nanofiber pattern 210-2 including the second nanofiber opening 211-2 (see FIG. 16). The second nanofiber transfer step is performed in the same manner as that of the first nanofiber transfer step.

Figure 16:
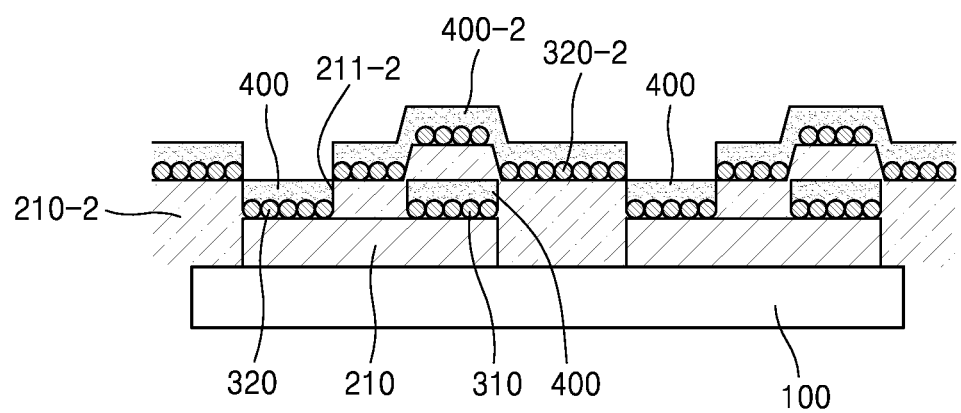

Subsequently, as shown in FIG. 16, a protective layer formation step is performed. In the protective layer formation step, a protective layer 400-2 is formed on side of the second nanofiber bundle NFS 320-1. A substantial protective layer 410 is formed on one side of the second nanofiber 320 formed on the substrate 100 through the second nanofiber opening 211-2.

Figure 17:
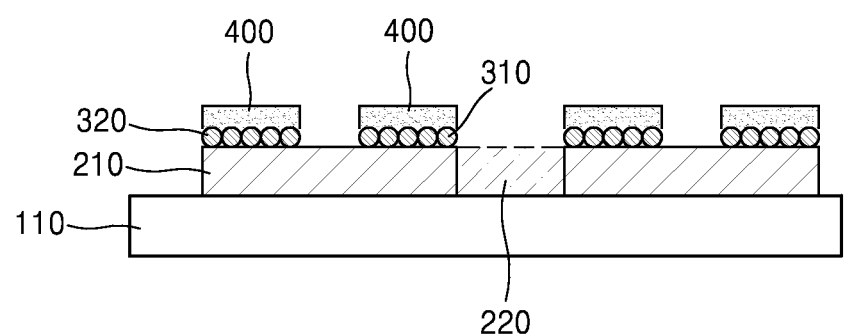

Thereafter, as shown in FIG. 17, a lift-off step of removing the photoresist formed on the substrate to form the second nanofiber pattern is performed. Through this process, a structure of the second nanofiber 320 for interconnecting the first electrode and the second electrode in the same module unit body and the protective layer 400 for protecting the second nanofiber 320 on the substrate 100, and a structure of the first nanofiber 310/the protective layer 400 formed previously can be formed on one side of the substrate 100. By virtue of this structure, as shown in FIG. 4, it is possible to manufacture the thermoelectric generator module using nanofibers alignedly formed through the electrospinning apparatus having a structure in which a plurality of module unit bodies are consecutively connected in series.

In the meantime, in the above embodiment, for the nanofiber-based thermoelectric generator module using the nanofiber bundle formed by the method of the present invention, a structure has been illustrated in which the electrodes and the nanofibers are arranged on the same plane so as to be consecutively connected in series, but the present invention is not limited to a method in which the nanofibers formed by the present invention form the bundle and the nanofiber-based thermoelectric generator module may form a stereoscopic stack structure using a layered web structure to maximize the feed rate of a charge carrier.

Figure 18:
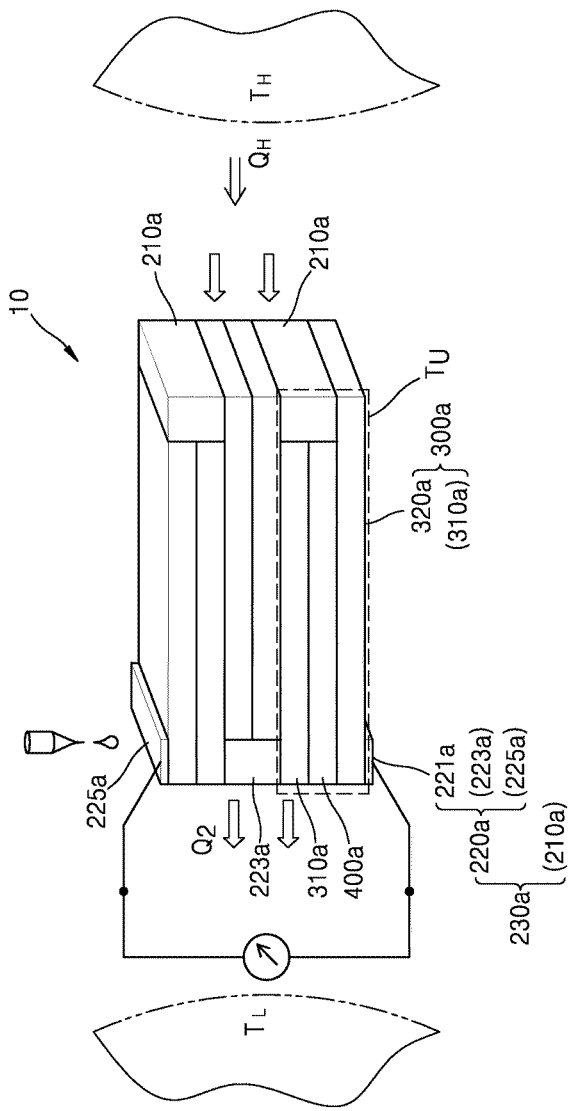
FIG. 18 is a diagrammatic view illustrating an entire configuration of a nanofiber-based thermoelectric generator module according to still another embodiment of the present invention.

In other words, as shown in FIG. 18, the nanofiber-based thermoelectric generator module 10 includes a plurality of module unit bodies arranged between two different heat sources, i.e., a hot source $T_H$ and a cold source $T_L$ so that thermoelectric power generation according to a temperature difference between electrodes can be performed through the input of heat from one side and generation of heat loss. In this case, the module unit body 10 includes a first nanofiber mesh 310a, a second nanofiber mesh 320a, and an insulator layer 400a. In addition, the module unit body 10 includes a first electrode 210a and a second electrode 220a (221a, 223a and 225a), which are arranged so as to be in series connected sequentially.

In the case where the first electrode and the second electrode are transparent electrodes, and the insulator layer also has a preset light transmission property, the light transmission property of the desired design specification can be secured through the preset light transmission property that allows light to be transmitted from one side to the other side of an entire stack structure. The insulator layer may be formed of, for example, a material having a light transmission property such as perylene N, perylene C, perylene D or the like so that it can include a preset light transmission property that allows light to be transmitted from one side to the other side of the entire stack structure.

The insulator layer may be formed of a different material. In addition, the insulator layer may take a structure in which a refractive index is adjusted in the selection of a material for the insulator layer to achieve an individual design arrangement on each layer to solve a visual inconvenience.

Such an insulator layer can be selectively designed as a transparent layer, a reflective layer or the like, and can be selected in various manners depending on the design specification.

The first nanofiber mesh 310a and the second nanofiber mesh 320a are provided. The first nanofiber mesh 310a and the second nanofiber mesh 320a forming a layered web structure are provided as nanofiber meshes manufactured by the electrospinning apparatus 1 for manufacturing nanofibers. A process of manufacturing the nanofiber meshes has been described above, and thus a detailed description thereof will be omitted to avoid redundancy.

Similarly to the nanofiber bundle as described above, the first nanofiber mesh 310a includes an n-type or p-type semiconductor, and the second nanofiber mesh 320a includes a semiconductor of a type different from the type of the semiconductor forming the first nanofiber. Thus, the first and second nanofiber meshes take an alternative structure in which if the first nanofiber mesh includes an n-type semiconductor, the second nanofiber mesh includes a p-type semiconductor, and if the first nanofiber mesh includes a p-type semiconductor, the second nanofiber mesh includes an n-type semiconductor.

The insulator layer 400a is interposed between the first nanofiber mesh 310a and the second nanofiber mesh 320a to form a surface stack structure. In this embodiment, the insulator layer 400a is formed as, for example, a thin film sheet including a nitride layer or an oxide layer. Examples of a material for forming the nitride layer or the oxide layer may include may include $Al_2O_3$, $Ta_2O_5$, $SiO2$, $SiBN$ and $Si_3N_4$.

In addition, a first electrode 210a and a second electrode 220a are formed. The first electrode 210a and the second electrode 220a according to an embodiment of the present invention are formed of a conductive slurry or a conductive solution. After a solvent is evaporated, only a conductive material such as metal remains on the first electrode 210a and the second electrode 220a so that a first nanofiber mesh and a second nanofiber mesh in the same module unit body can be connected to each other or first nanofiber meshes and second nanofiber meshes between heterogeneous adjoining module unit bodies can be connected to each other to allow a flow of a charge derivative to be performed between the stacked nanofiber meshes in a consecutive and serial manner. Such a stack structure, the first electrode 210a and the second electrode 220a take a structure in which a plurality of the first electrodes 210a are exposed to one of the hot source and the cold source and a plurality of the second electrodes 220a are exposed to the other of the hot source and the cold source.

Figure 22:
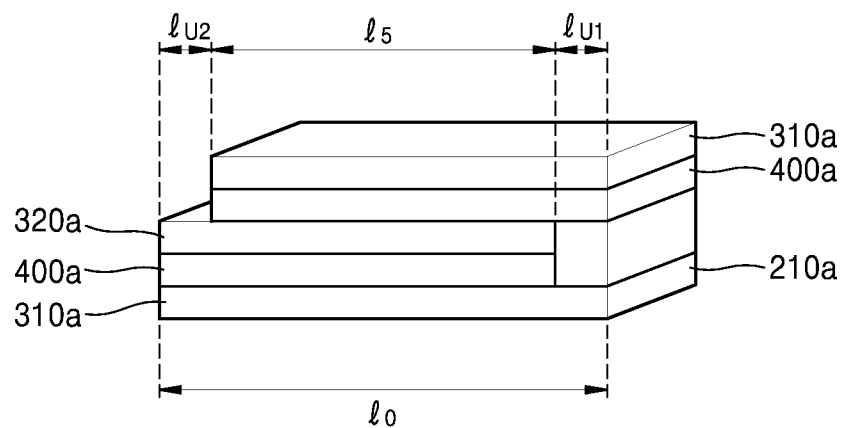
Figure 23:
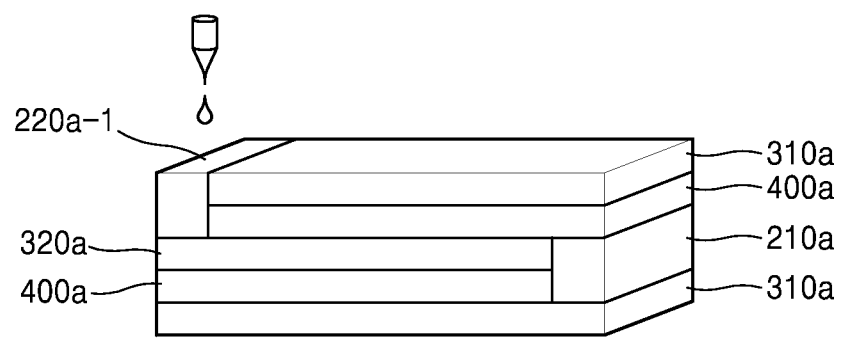
Figure 25:
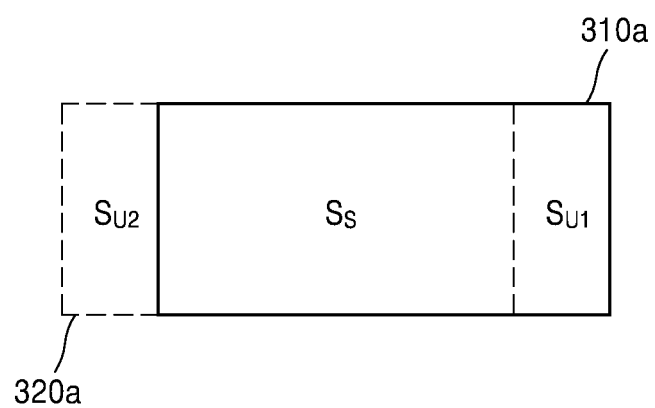
FIG. 25 is a schematic diagrammatic view illustrating a stack region.

In the stack structure of the nanofiber meshes and the insulator layer, a mesh intersection region and a mesh non-intersection region are formed, and the electrodes are arranged using a difference between the mesh intersection region and the mesh non-intersection region so that a compact structure of the apparatus can be implemented. In other words, as shown in FIG. 25, when the nanofiber meshes stacked are viewed from the top, the first nanofiber mesh and the second nanofiber mesh may take a structure of having the same entire area so that both ends thereof are arranged in an alternately staggered arrangement, if necessary. Such a structure, i.e., when viewed from the top, a mesh intersection region Ss where the nanofiber meshes of different types are and intersected when nanofiber meshes are stacked and projected onto a plane, and a mesh non-intersection region $S_{u1}$, $Su_2$ are generated. Referring to FIG. 22, nanofiber meshes stacked upwardly other than the outermost peripheral portion except a mesh layer disposed at the outermost peripheral portion having the size of a reference symbol lo have a length represented by ls+lu1 or ls+lu2 to form a mesh intersection region, and the entire width of the stack structure has a size of ls+lu1+lu2 (=lo) and both ends thereof are aligned. On the mesh non-intersection region ($S_{u1}$, $S_{u2}$), may be disposed electrodes cured through a certain curing process, if necessary, after the conductive solution or the conductive slurry is discharged and coated in a liquid state.

Hereinafter, a process of manufacturing the nanofiber-based thermoelectric generator module 10a having the stack structure as shown in FIG. 18 will be described with reference to FIGS. 19 to 24.

First, a first nanofiber mesh 310a and a second nanofiber mesh 320a are provided. The thermoelectric generator module manufacturing process employing an alternately electrically charging scheme using the electrospinning apparatus for manufacturing nanofibers of the first nanofiber mesh and the second nanofiber mesh is the same as that in the above process, and thus a detailed description thereof will be omitted to avoid redundancy and will be replaced with the above case. Herein, a configuration in which the nanofibers of the first nanofiber mesh and the second nanofiber mesh include an n-type or p-type conductor or semiconductor selectively is the same as in the above configuration.

Thereafter, a module unit body stacking step is performed in which one or more module unit bodies each including the first nanofiber mesh and the second nanofiber mesh are stacked. The module unit body stacking step includes a first nanofiber mesh arrangement step, an insulator layer arrangement step, a second nanofiber mesh arrangement step, a first electrode formation step, another insulator layer arrangement step, another first nanofiber mesh arrangement step, and a second electrode formation step. The module unit body stacking step is repeatedly performed by a preset number of times or the thermoelectric generator module can be manufactured in such a manner that a partial configuration of the module unit body is additionally stacked by a preset individual number of times. As used herein, the term "module unit body" refers to a minimum unit that forms a nanofiber-based thermoelectric generator module including a nanofiber mesh manufactured through the thermoelectric spinning method for the nanofibers. The module unit body can be stacked in plural numbers, and an adjoining module unit which is consecutively stacked on one module unit body or is previously formed prior to the formation of the one module unit body is called "another nodule unit body".

Figure 19:
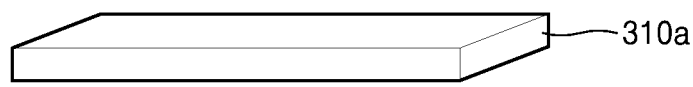
FIGS. 19 to 24 illustrate partial perspective views and partial side cross-sectional views of a nanofiber-based thermoelectric generator module during the manufacture thereof according to still another embodiment of the present invention.
Figure 20:
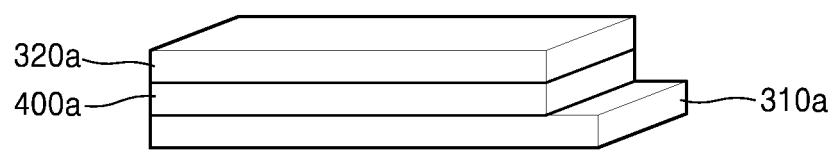
Figure 21:
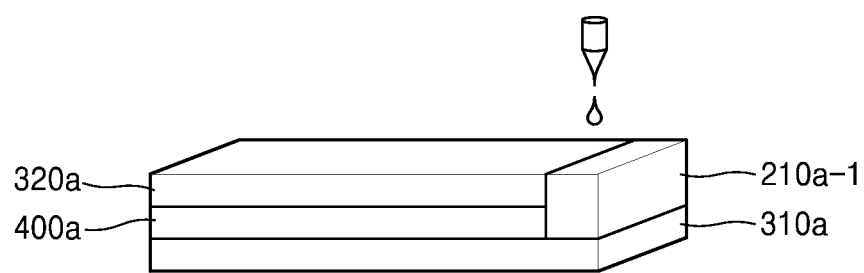

As shown in FIG. 19, after a first nanofiber mesh 310a is arranged, an insulator layer 400a is arranged on the first nanofiber mesh 310a and a second nanofiber mesh 320a is arranged on one side of the insulator layer 400a (see FIG. 20). In this case, the first nanofiber mesh and the second nanofiber mesh, and the insulator layer interposed therebetween, if necessary, are arranged such that both ends of the first and second nanofiber meshes and the insulator layer are aligned, and the mesh intersection region and the mesh non-intersection region are formed. Subsequently, a conductive slurry or a conductive solution is coated onto the second nanofiber mesh 320a in a liquid droplet state (210a-1) to form a first electrode 210a so that one ends of the first nanofiber mesh and the second nanofiber mesh are connected to each other by the first electrode 210a (see FIG. 21). Thereafter, another insulator layer 400a of the module unit body is arranged on the second nanofiber mesh 320a coated with the conductive slurry or solution, and a first nanofiber mesh 310a forming another module unit body is arranged on one side of the other insulator layer 400a (see FIG. 22). Then, a conductive slurry or solution is coated onto the first nanofiber mesh 310a in a liquid droplet state (220a-1) as in the first electrode formation step to form a second electrode 220a (see FIG. 23). Herein, more specifically, the first electrode formation step or the second electrode formation step may include an electrode coating step and an electrode curing step. An electrode coating step of coating a conductive slurry or solution in a liquid droplet state, and an electrode curing step of exposedly curing the coated conductive slurry or solution in a constant temperature environment to remove a volatile material from the conductive slurry or solution may be performed.

Figure 24:
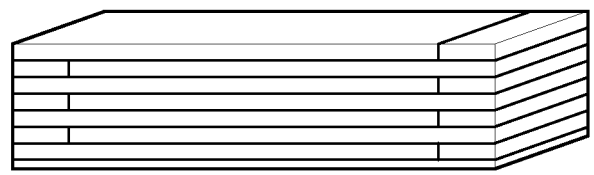

The thus manufactured module unit body may be stacked in plural numbers to form a stack-type, nanofiber-based thermoelectric generator module including a predetermined number of module unit bodies (see FIG. 24). Herein, an individual electrode can be formed at a nanofiber mesh at the outermost peripheral portion. Although not shown, a protective layer such as an insulator layer for protecting the nanofiber mesh at the outermost peripheral portion may be arranged, if necessary.

In the above embodiments, the first nanofiber and the second nanofiber can be configured selectively within the scope of taking different types, and thus the formation position or the stacking order of the first nanofiber and the second nanofiber on the substrate can be modified in various manners depending on the design specification.

The thermoelectric generator module of the present invention as constructed above can be applied to a wide range of fields in which heat and electricity are combined, such as an automobile part such as a temperature adjustment seat (e.g., climate C-ntr-l), a semiconductor (e.g., circulator, cooling plate), a biological product (e.g., blood analyzer, PCR, sample temperature cycling tester), a scientific field (spectrophotometer), an optical field (CCD cooling, infrared sensor cooling, laser diode cooling, SHG laser cooling), a computer field (CPU cooling), a home appliance (kimchi refrigerator, mini refrigerator, hot and cold water dispenser, wine refrigerator, rice container, dehumidifier), a power generation field (waste heat generator, remote power generation), etc. In other words, the thermoelectric generator module of the present invention can be modified in various manners within a range of forming a hybrid structure enabling the realization of a large-area module through a structure in which a surface contact is possible for an element whose heat is emitted from a heat source so that the module unit bodies are horizontally arranged perpendicularly to a transfer direction of heat radially emitted from the heat source. Further, the inventive thermoelectric generator module may be utilized as a power source for a portable device such as a smart phone, a tablet or the like through the realization of self-power generation using heat emitted from the human body by taking a structure in which the module is built in a flexible substrate or a structure in which the module is built in a functional fiber as a flexible material.

In addition, the substrate or the electrodes may be formed of a transparent material or a certain material so as to be installed on a glass of a building, a vehicle, and the like so that the thermoelectric generation module can be utilized as a power generation facility employing an external heat source.

Figure 26:
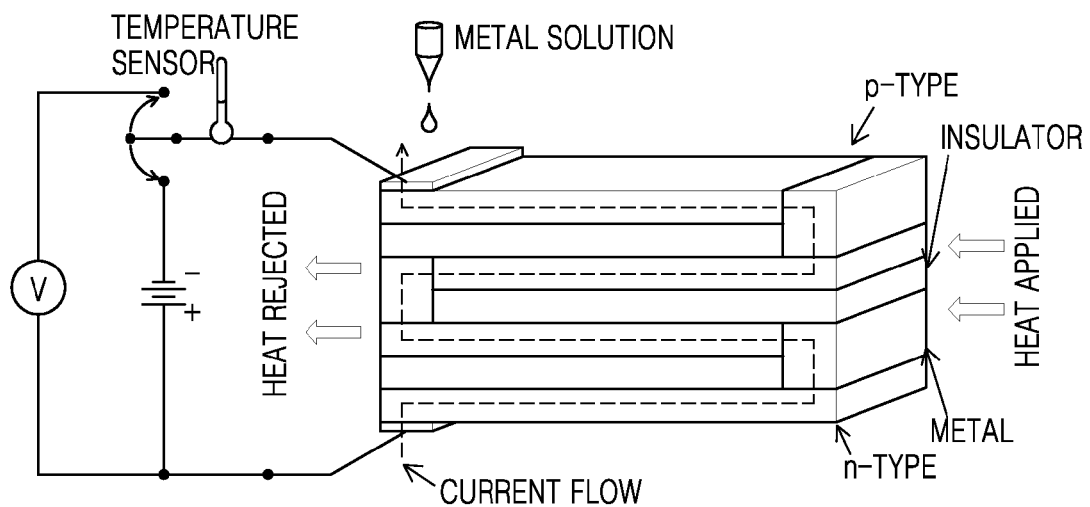
FIG. 26 is a diagrammatic view illustrating another use example of a nanofiber-based thermoelectric generator module according to still another embodiment of the present invention.

Further, as shown in FIG. 26, as the effects of the present invention, it is apparent from the above contents that electric power is supplied in a given control state through a switch and a power supply unit that are driven in response to a control signal from a given control unit so that a structure having an improved thermal radiation property can be implemented through an urgent cooling operation at a capture region by a surface contact or spaced structure (preferably, the surface contact), thereby preventing an erroneous operation of the entire system.

While the configuration and operation of the nanofiber-based thermoelectric generator module, the method of manufacturing the same, and the electrospinning apparatus of manufacturing nanofibers for the nanofiber-based thermoelectric generator module of the present invention have been described in connection with the exemplary embodiments illustrated in the drawings, they are merely illustrative and the invention is not limited to these embodiments. It will be appreciated by a person having an ordinary skill in the art that various equivalent modifications and variations of the embodiments can be made without departing from the spirit and scope of the present invention. Therefore, the true technical scope of the present invention should be defined by the technical sprit of the appended claims.

What is claimed is:
1. A nanofiber-based thermoelectric generator module comprising:
a plurality of module unit bodies stackingly formed on each other in a stacking direction and longitudinally disposed between a hot source and a cold source, the hot source and the cold source being two different heat sources from each other, wherein each respective module unit body of the module unit bodies comprises:
- a first nanofiber mesh including a first nanofiber including an n-type semiconductor or a p-type semiconductor;
- a second nanofiber mesh including a second nanofiber including a semiconductor of a type that is the n-type or the p-type, and different from the type, that is the n-type or the p-type, of the semiconductor forming the first nanofiber;
- an insulator layer interposed between the first nanofiber mesh and the second nanofiber mesh;
- a first electrode configured to interconnect ends of the first nanofiber mesh and the second nanofiber mesh; and
- a second electrode connected at one end thereof to the second nanofiber mesh and connected at another end thereof to the first nanofiber mesh of another adjoining one of the stacked module unit bodies, wherein
- a mesh overlap region is formed, where, taken from a plan view in the stacking direction, the first nanofiber mesh of the respective module unit body overlaps with the second nanofiber mesh,
- a mesh non-overlap region is formed, where, taken from a plan view in the stacking direction, the first nanofiber mesh of the respective module unit body is placed without overlapping with the second nanofiber mesh or the second nanofiber mesh of the respective module unit body is placed without overlapping with the first nanofiber mesh of said another adjoining one of the stacked module unit bodies, and
- at least one of
    - the first electrode is disposed at the mesh non-overlap region to be directly connected to and to be stacked in the stacking direction directly on a portion of the first nanofiber mesh that is disposed in the mesh non-overlap region, and
    - the second electrode is disposed at the mesh non-overlap region to be directly connected to and to be stacked in the stacking direction directly on a portion of the second nanofiber mesh that is disposed in the mesh non-overlap region.

2. The nanofiber-based thermoelectric generator module according to claim 1, wherein the first electrode and the second electrode have a light transmission property that allows light to be transmitted therethrough.

3. The nanofiber-based thermoelectric generator module according to claim 1, wherein for each respective module unit body of the module unit bodies, both the second electrode is disposed at the mesh non-overlap region to be directly connected to the first nanofiber of the another adjoining one of the stacked module unit bodies at the position in the mesh non-overlap region,
the first electrode is disposed at the mesh non-overlap region to be directly connected to the second nanofiber mesh at the position in the mesh non-overlap region.

4. The thermoelectric generator module according to claim 3, wherein the first electrode and the second electrode are formed of a conductive slurry or a conductive solution.

5. The thermoelectric generator module according to claim 3, wherein the first electrode and the second electrode are each formed of a conductive film or a conductive paste.

6. The thermoelectric generator module according to claim 1, wherein the first electrode and the second electrode are transparent electrodes, and the insulator layer has a light transmission property to allow light to pass therethrough.

7. The nanofiber-based thermoelectric generator module according to claim 1, wherein a bottom surface of the first electrode is disposed at a level same as a level at which a top surface of the first nanofiber mesh is disposed.

8. The nanofiber-based thermoelectric generator module according to claim 7, wherein a bottom surface of the second electrode is disposed at a level same as a level at which a top surface of the second nanofiber mesh is disposed.

* * * * *